(12) United States Patent
Kripesh et al.

(10) Patent No.: US 7,160,756 B2
(45) Date of Patent: Jan. 9, 2007

(54) POLYMER ENCAPSULATED DICING LANE (PEDL) TECHNOLOGY FOR CU/LOW/ULTRA-LOW K DEVICES

(75) Inventors: Vaidyanathan Kripesh, Singapore (SG); Seung Wook Yoon, Singapore (SG); Ganesh Vetrivel Periasamy, Singapore (SG)

(73) Assignee: Agency for Science, Techology and Research, Singapore (SG)

( * ) Notice: Subject to any disclaimer, the term of this patent is extended or adjusted under 35 U.S.C. 154(b) by 291 days.

(21) Appl. No.: 10/963,285

(22) Filed: Oct. 12, 2004

(65) Prior Publication Data

US 2006/0079025 A1    Apr. 13, 2006

(51) Int. Cl.
     *H01L 21/44*      (2006.01)

(52) U.S. Cl. .............................. 438/114; 257/E23.116; 257/E21.502

(58) Field of Classification Search ................ 438/114
See application file for complete search history.

(56) References Cited

U.S. PATENT DOCUMENTS

| 6,187,663 B1 | 2/2001 | Yu et al. ..................... 438/624 |
| 6,281,115 B1 | 8/2001 | Chang et al. ................ 438/637 |
| 2003/0013232 A1* | 1/2003 | Towle et al. ................ 438/113 |

OTHER PUBLICATIONS

Derwent Abstract Accession No. 2002-664161/71, Korean Patent Abstract only, KR 2002-0030150 A (Hynix Semiconductor Inc) Apr. 24, 2002, "Method for Fabricating Wafer Level Package".

* cited by examiner

*Primary Examiner*—W. David Coleman
(74) *Attorney, Agent, or Firm*—Saile Ackerman LLC; Stephen B. Ackerman

(57) ABSTRACT

A process for packaging semiconductor devices for flip chip and wire bond applications, wherein specific materials of the semiconductor devices are protected during device processing sequences and dicing procedures, has been developed. After definition of copper interconnect structures surrounded by a low k insulator layer, a protective, first photosensitive polymer layer comprised with a low dielectric constant is applied. After definition of openings in the first photosensitive polymer layer exposing portions of the top surface of the copper interconnect structures, a dicing lane opening is defined in materials located between copper interconnect structures. Conductive redistribution shapes are formed on the copper interconnect structures exposed in the openings in the first photosensitive polymer layer, followed by application of a protective, second photosensitive polymer layer. An opening is defined in the second photosensitive polymer layer exposing a portion of the top surface of a redistribution shape followed by placement of a solder ball in this opening. A reflow anneal procedure results in the solder ball wetting and overlying only the portion of the redistribution shape exposed in the opening in the second photosensitive polymer layer. Separation of the solder ball, flip chip regions from the non-solder ball, wire bond regions is accomplished via a dicing procedure performed in the dicing lane.

26 Claims, 7 Drawing Sheets

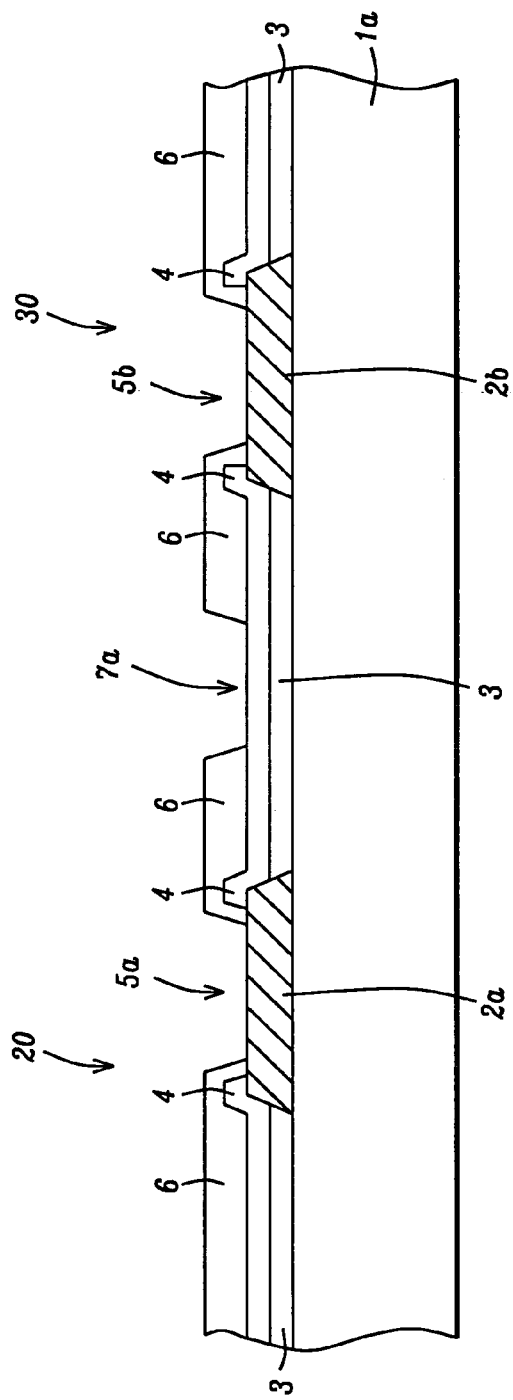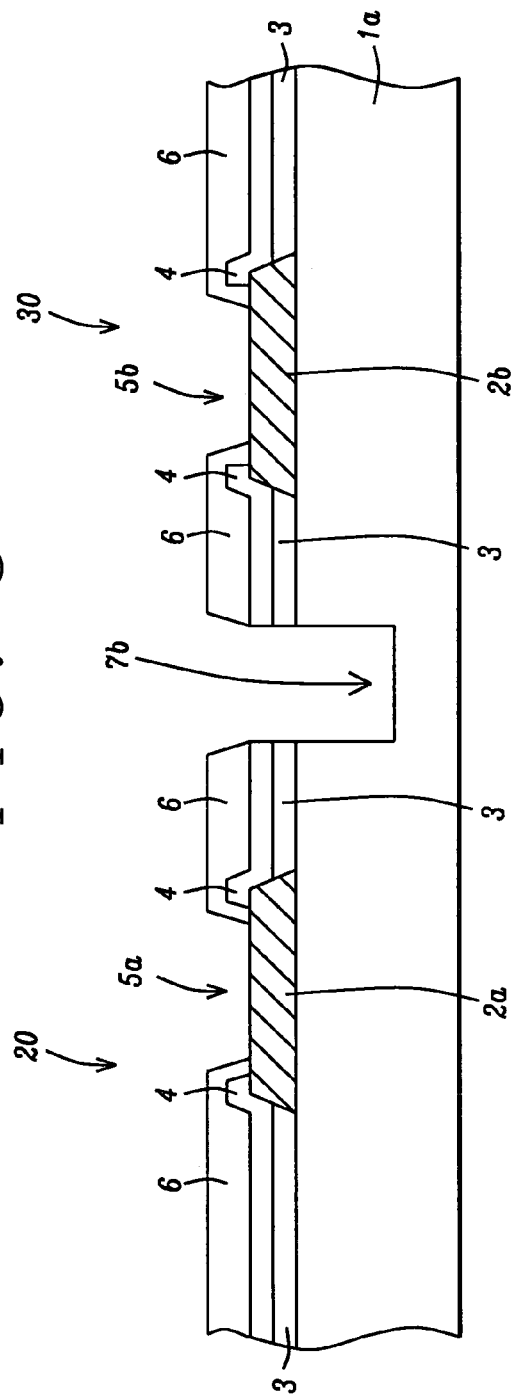

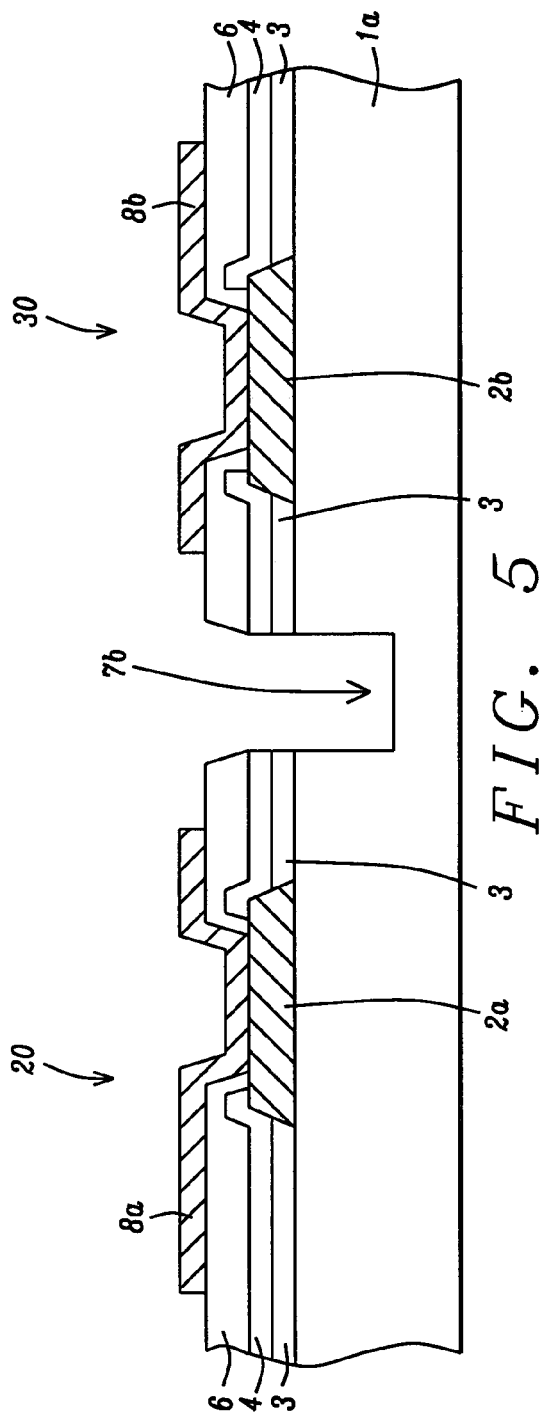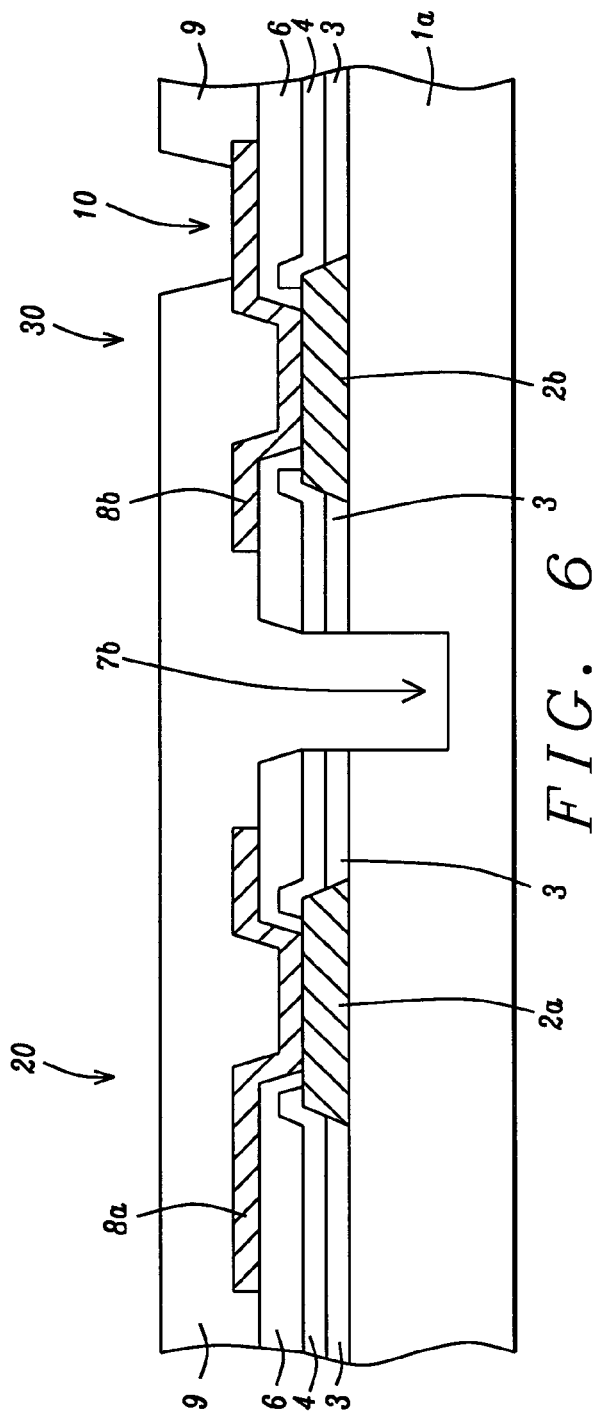

POLYMER ENCAPSULATED DICING LANE (PEDL) TECHNOLOGY FOR CU/LOW/ULTRA-LOW K DEVICES

BACKGROUND OF THE INVENTION (1) Field of the Invention

The present invention relates to methods used to fabricate semiconductor devices and packages, and more specifically to a method used to protect the copper interconnects and low dielectric constant (low k) materials of the semiconductor device during subsequent dicing, interconnection processes and further packaging procedures.

(2) Description of Prior Art

To increase semiconductor device performance or to decrease resistance—capacitances (RC) delay the semiconductor industry has been employing copper as an interconnect material replacing more resistant aluminum based structures, while employing dielectric layers with a lower dielectric constant than silicon oxide to replace higher dielectric constant materials. The presence of low k layers, resulting in decreased capacitance, however inherently presents lower mechanical and thermal stability than the higher k, silicon oxide layers. Therefore low k layers present in semiconductor devices can present yield as well as reliability vulnerabilities in terms of interfacial delamination and cracking which can occur in the low k layers as a result of subsequent semiconductor device or packing procedures. For example the flip chip process of connecting solder balls or bumps of a semiconductor chip to an underlying package, as well as the dicing procedure used to separate individual semiconductor chips from a completed semiconductor substrate, can result in undesirable phenomena such as adhesion losses between copper and the low k layer, as well as micro-cracking of these same materials. To enhance the mechanical strength of these materials undoped silica glass (USG) layers have been formed on the underlying low k layers and copper interconnect structures allowing these structures to more adequately survive subsequent processing procedures, however the presence of the higher k, USG layers increase parasitic capacitance thus reducing the performance benefit derived with the use of low k layers.

The present invention will offer materials and a process sequence in which the performance benefit of low k layers and copper interconnect structures is not compromised via the presence of overlying higher k dielectric layers, while the mechanical vulnerabilities of the low k and copper interconnect structures are not adversely influenced during subsequent process steps such as formation of redistribution layers (RDL) for the solder bumps, formation of solder bumps, or the dicing procedure. Prior art such as Yu et al in U.S. Pat. No. 6,187,663 B1, as well as Chang et al in U.S. Pat. No. 6,281,115 B1, describe methods of fabricating semiconductor devices comprised with low k layers and copper interconnect structures, however these prior art do not describe the process sequence or materials described in the present invention in which the low k layers and copper interconnect structures are protected by low k polymer encapsulation during pre-dicing as well as during dicing procedures.

SUMMARY OF THE INVENTION

It is an object of this invention to fabricate semiconductor devices comprised with copper interconnect structures and low k insulator layers.

It is another object of this invention to form polymer layers to encapsulate the copper interconnect structures and low k insulator layers prior to formation of a redistribution layer (RDL) and prior to a dicing procedure.

It is still another object of this invention to form a dicing scribe lane in the polymer encapsulated layer, in the low k insulator layer, and in a top portion of the semiconductor substrate, prior to a final dicing procedure.

In accordance with the present invention a method of protecting semiconductor components such as copper interconnect structures and low k insulator layers from subsequent fabrication processes and from a subsequent dicing procedure, via use of an overlying polymer encapsulation layer, is described. After formation of copper interconnect structures a low dielectric constant (low k) insulator layer is deposited then subjected to a patterning procedure to expose top portions of copper interconnect structures. A first photosensitive polymer layer is next applied and patterned to again expose portions of top surfaces of underlying copper interconnect structures as well as exposing a top portion of the low k insulator region located between copper interconnect structures, the region to be subsequently used as a dicing lane. A selective etch procedure is next employed to define the dicing lane in the exposed low k layer and in an underlying top portion of the semiconductor substrate. A redistribution layer (RDL), is next deposited and patterned to form a first RDL structure on a portion of the top surface of the first photosensitive polymer layer and on the exposed portion of the top surface of a first copper interconnect structure in a region of the semiconductor substrate designed for flip chip packaging. A second photosensitive polymer layer is applied and patterned to form an opening in the second photosensitive polymer layer exposing a portion of the top surface of the first RDL structure in the flip chip region of the semiconductor substrate. A solder ball is placed in the opening in the second photosensitive polymer layer with a subsequent reflow procedure resulting in the solder ball interfacing and overlying the exposed portion of the first RDL structure. A dicing procedure is now performed in the dicing lane resulting in separation of the flip chip devices from non-solder ball, wire bond devices.

BRIEF DESCRIPTION OF THE DRAWINGS

The object and other advantages of this invention are best described in the preferred embodiments with reference to the attached drawings that include:

FIGS. 1–10, which schematically in cross-sectional style show key stages employed to fabricate semiconductor devices comprised with copper interconnect structures and low k layers, featuring polymer encapsulation layers used to protect key components of the semiconductor device during specific processing steps such as dicing.

DESCRIPTION OF THE PREFERRED EMBODIMENTS

Figure 1:
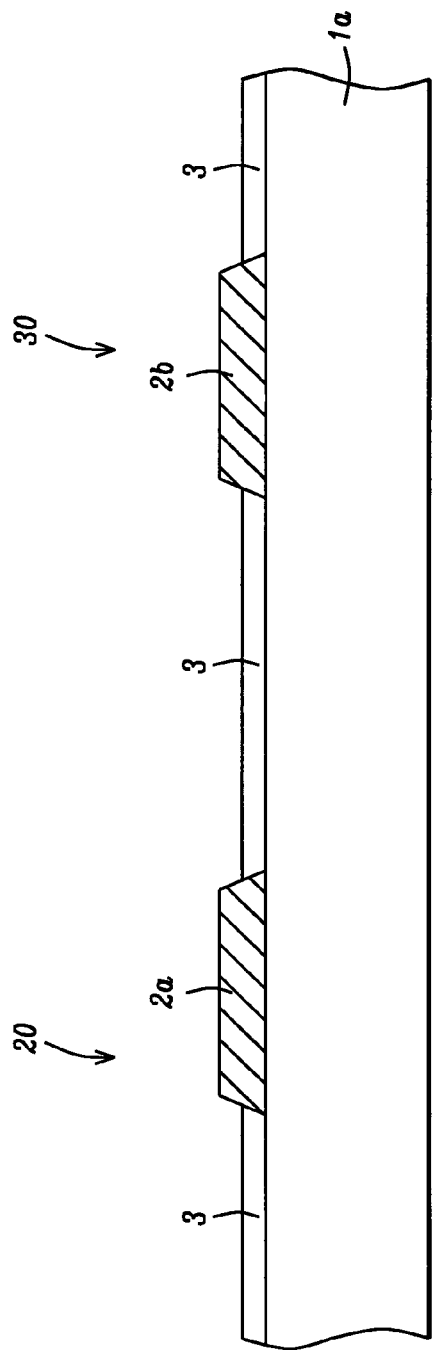

The method of fabricating a semiconductor device comprised with copper interconnect structures and low k layers featuring polymer encapsulation layers used to protect the key components of the semiconductor device during specific processing steps such as dicing, will now be described in detail. Semiconductor substrate 1, which will be used to provide the final diced chips, is schematically shown in FIG. 1. Semiconductor substrate 1, is comprised with the necessary micro-electronic elements, (not shown in the drawings), such as metal oxide semiconductor field effect transistor (MOSFET) devices, resistors, and capacitors. These elements formed via front end of the line (FEOL), as well as back end of the line (BEOL), processes, are either embedded in, or located on the top surface of semiconductor substrate 1. Portion 20, of semiconductor substrate 1, will be used to fabricate devices which will require wire bonding for subsequent external connection, while portion 30, of semiconductor substrate 1, will be used to fabricate the devices which will experience a flip chip external connection necessitating the use of solder balls. Insulator layer 3, a layer such as silicon oxide, is first formed via chemical vapor deposition procedures at a thickness between about 1,000 to 30,000 Angstroms, followed by photolithographic patterning and etching procedures used to form openings in insulator layer 3, exposing conductive regions in semiconductor substrate 1. Copper interconnect structures 2a, to be used in the fabrication of semiconductor chips requiring wire bond applications, and copper interconnect structures 2b, to be used in the fabrication of semiconductor devices targeted for flip chip, solder ball applications, are next formed in openings in insulator layer 3, overlying and contacting the conductive regions of MOSFET, resistor, or capacitors elements on, or in semiconductor substrate 1. Copper interconnect structures are obtained by initial formation of a copper layer at a thickness between about 1,000 to 30,000 Angstroms, via CVD or electroplating procedures, followed by photolithographic masking and dry etching procedures such as reactive ion etching (RIE), using $Cl_2$ as an etchant for copper. If desired a tantalum or tantalum nitride layer can be formed via CVD or via physical vapor deposition (PVD) procedures, prior to formation of copper, to be used as a barrier layer to protect adjacent materials from copper poisoning. Removal of the masking photoresist shapes used to define the copper interconnect structures is accomplished via plasma ashing procedures. The result of the above procedures is schematically shown in FIG. 1.

Figure 2:
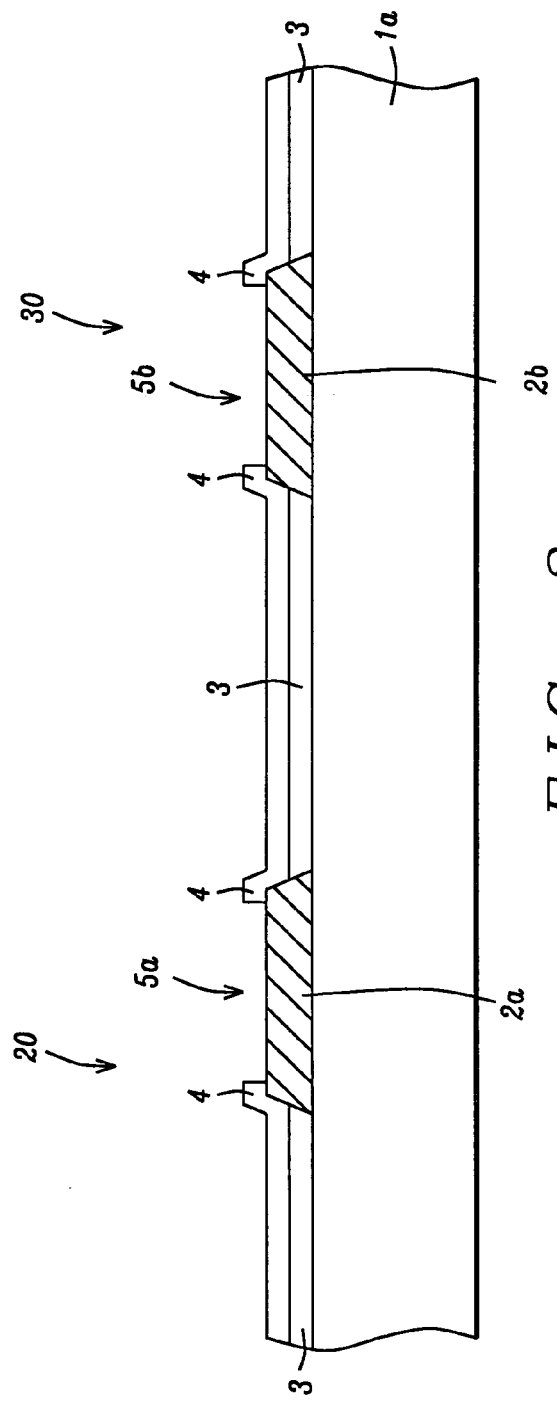

Low k insulator layer 4, a layer such as hydrogen silsesquioxane (HSQ) or a non-porous silica, is next formed either via spin-on or via CVD procedures, at a thickness between about 1,000 to 20,000 Angstroms. Low k insulator layer 4, features a dielectric constant between about 2–3. Photolithographic and dry etching procedures such as reactive ion etching, are again employed to form openings 5a, and 5b, in low k insulator layer 4, exposing a top portion of copper interconnects structures 2a, and 2b. The dry etching procedure is selectively performed using $CHF_3$ or $CF_4$ as an etchant for low k insulator layer 4, with the dry etch procedure selectively terminating at the appearance of the top surface of the copper interconnect structures. Removal of the photoresist shapes used to define openings 5a, and 5b, is again accomplished via plasma oxygen ashing procedures. The result of these procedures is schematically shown in FIG. 2.

To minimize damage to low k insulator layer 4, and to the copper interconnect structures. during subsequent processing sequences a protective polymer layer is formed overlying these materials. First polymer layer 6, a photosensitive, low k layer such as benzocyclobutene (BCB), is applied at a thickness between about 2,000 to 20,000 Angstroms. First polymer layer 6, comprised with a dielectric constant between about 2.5–2.8, will provide the same protection to underlying materials as higher dielectric constant materials such as silicon oxide, however without the additional capacitance which would result from overlying silicon oxide layers. In addition the photosensitive characteristic of first polymer layer 6, with the BCB example being a negative photosensitive material, allows unexposed portions of the BCB layer to be soluble in developer solutions. Removal of unexposed regions of first polymer layer 6, allows portions of openings 5a, and 5b, to be reopened again exposing portions of the top surface of the copper interconnect structures. In addition this procedure also results in opening 7a, in first polymer layer 6, exposing a portion of the top surface of low k insulator layer 4, in an area in which a dicing lane will be formed. The result of the above procedures is schematically shown in FIG. 3. If desired first polymer layer 6, can also be comprised of other photosensitive polymer layers such as polymide based materials.

Opening 7a, in first polymer layer 6, is next subjected to a selective etch procedure, allowing the formation of dicing lane 7b, shown schematically in FIG. 4, to be accomplished. A selective etch procedure such as a laser or plasma dry etch procedure, using $CHF_3$ or $CF_4$ as a selective etchant for low k insulator layer 4, for insulator layer 3, and for semiconductor substrate 1, allows dicing lane 7b, to be defined. First polymer layer 6, as well as the exposed portions of copper interconnect structures were not etched in the selective dry etch procedure. If desired a selective wet etch using a buffered hydrofluoric acid solution, as well as a mechanical prescibing procedure, can also be used to define dicing lane 7b.

For subsequent use with solder balls for flip chip or for wire bond applications, a conductive shape is formed to subsequently accommodate the solder ball or wire bonds. A conductive layer, defined as a redistribution layer (RDL), comprised of an underlying chromium, titanium or other metal component and an overlying nickel, copper or gold component, is first deposited via PVD procedures at a thickness between about 1,000 to 50,000 Angstroms. The metal RDL layer can also be prepare or deposited by electro or electroless plating procedures. Photolithographic and dry/wet etch procedures-are then used to selectively define RDL shape 8a, on a portion of the top surface of first polymer layer 6, and on a portion of the top surface of copper interconnect structure 2a, in addition to defining RDL shape 8b, on a portion of the top surface of first polymer layer 6, and on a portion of the top surface of copper interconnect structure 2b. The selective dry etch procedure is accomplished using $Cl_2$ as a selective etchant for the RDL layer, with the dry etch procedure terminating at the appearance of the top surface of first polymer layer 6. In addition the dry etch procedure re-opens dicing lane 6, with any over-etch resulting in additional removal of semiconductor substrate material exposed in dicing lane 6. The photoresist shapes used to define the RDL shapes are removed via plasma ashing or photoresist stripping procedures. The result of the RDL shape definition procedure is schematically shown in FIG. 5.

Second photosensitive polymer layer 9, again a material such as benzocyclobutene (BCB), is applied at a thickness between about 2,000 to 20,000 Angstroms. Second polymer layer 9, comprised with a dielectric constant between about 2.5–2.8, will again provide the same protection to underlying materials during subsequent processing procedures as first polymer layer 6, and via a low dielectric constant will result in only a minimum of additional device capacitance. After UV exposure through openings in a chromium photolithographic plate opening 10, is formed in second polymer layer 9, via removal of the soluble unexposed portions of second polymer layer 9, in a developer solution. This is schematically shown in FIG. 6.

Figure 7:
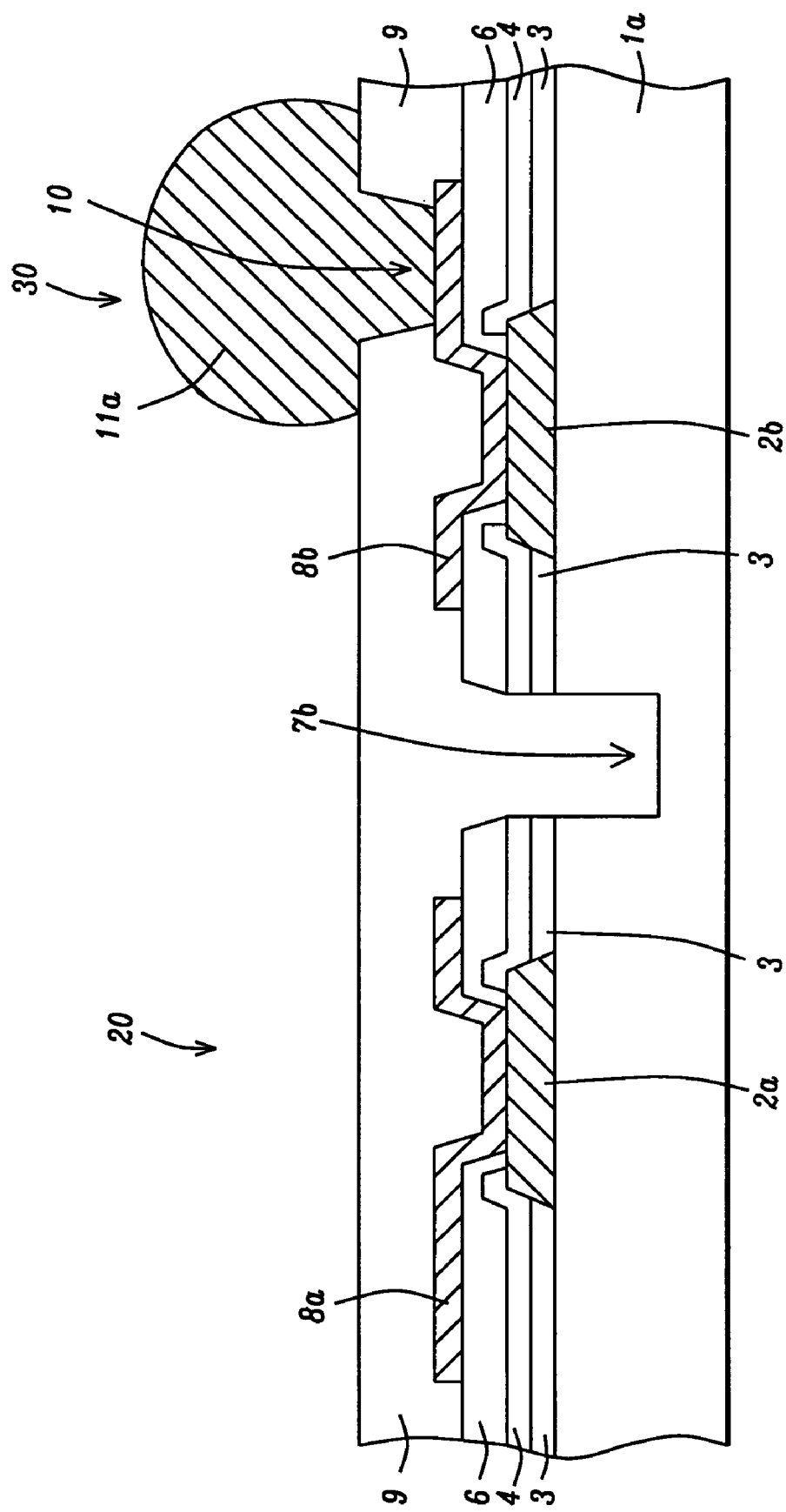
Figure 8:
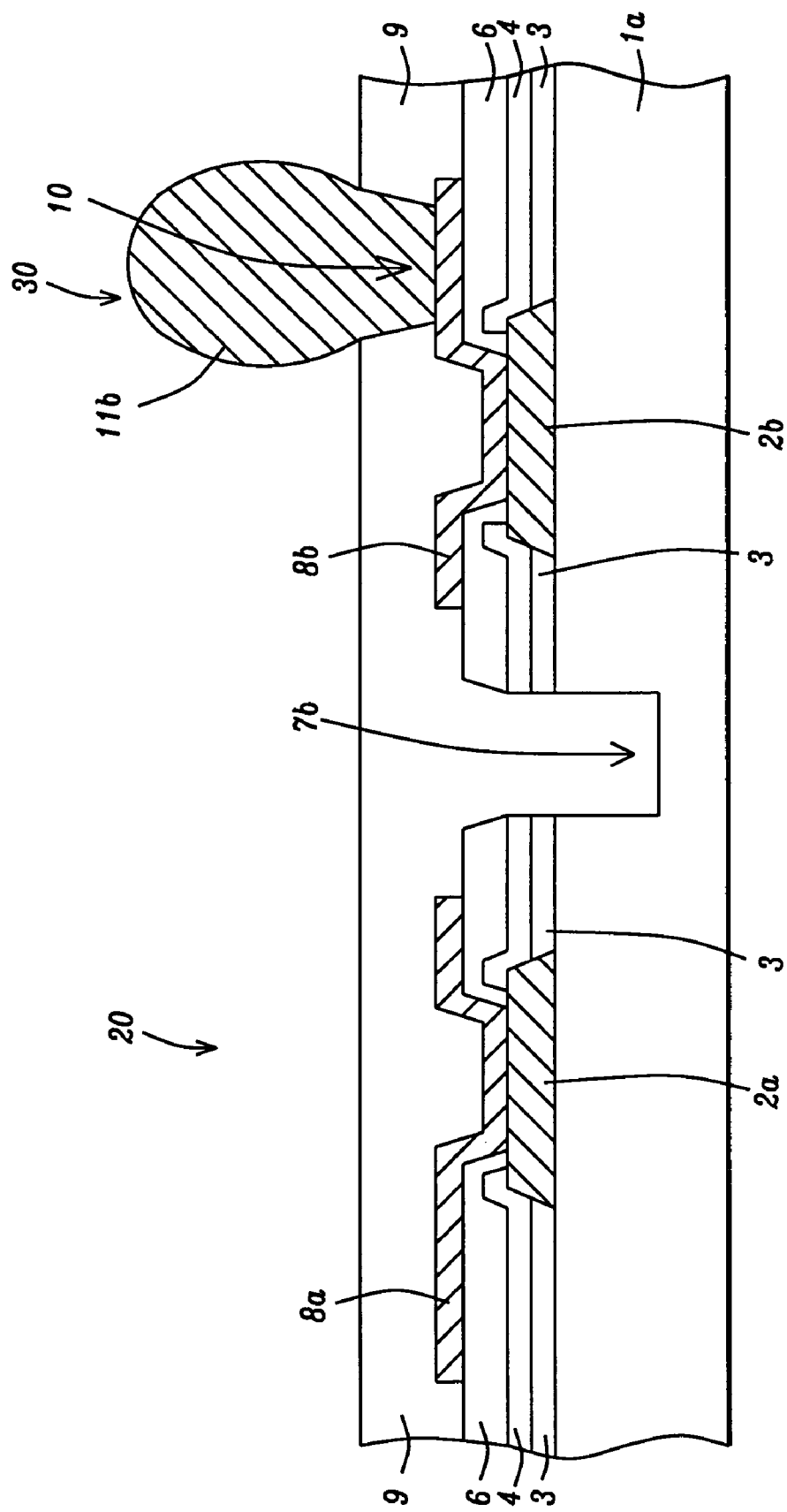
Figure 9:
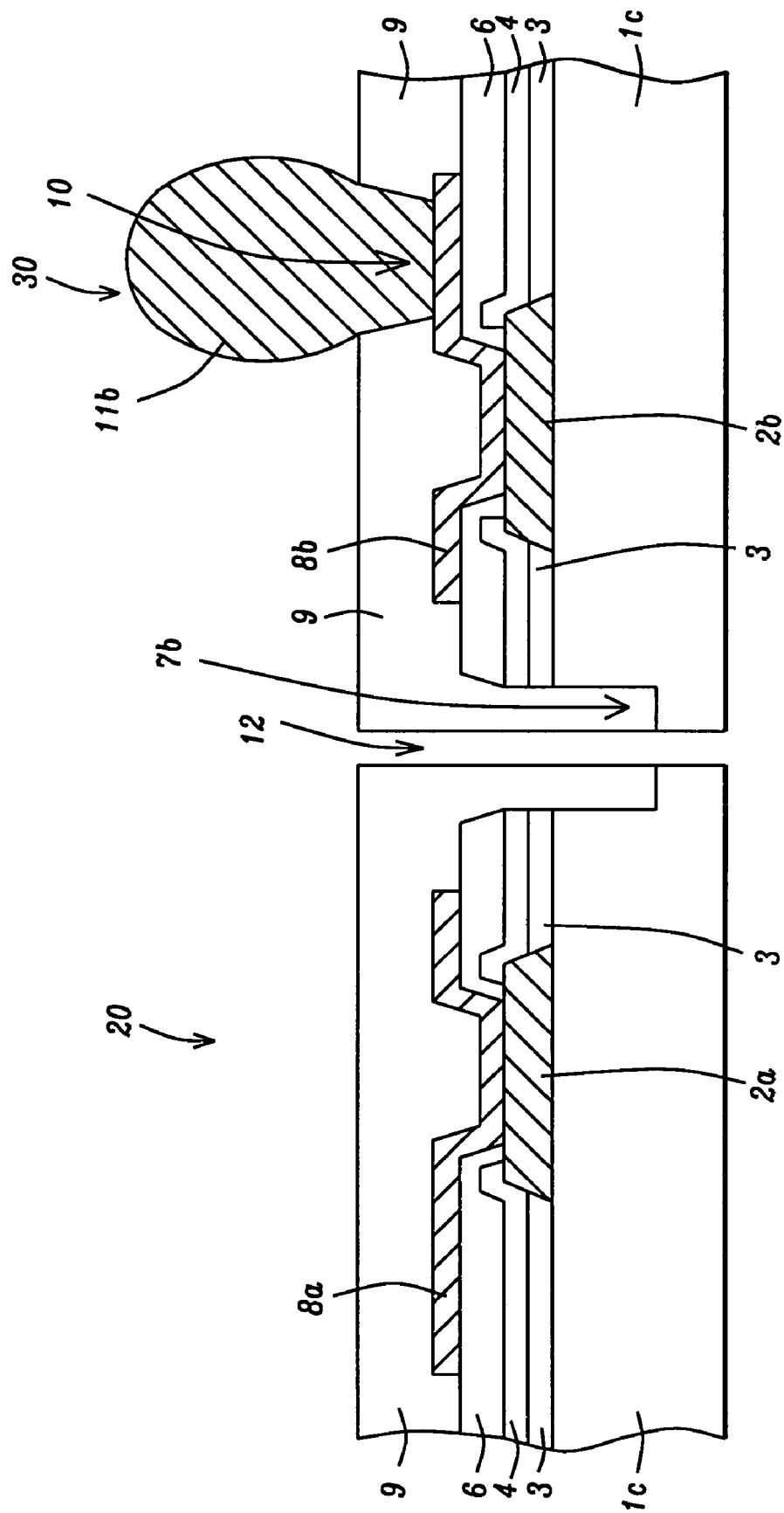

Solder ball 11a, comprised with a lead bearing or lead free composition, is then dropped or placed in a location overlying opening 10, and overlying portions of the top surface of second polymer layer 9. This is schematically shown in FIG. 7. A temperature cycle is next performed at a temperature between about 150 to 300° C., in a reducing gas ambient, allowing reflowing of the solder ball to occur, resulting in reflowed solder ball 11b, now intimately interfacing the portion of top surface of RDL shape 8b, exposed in opening 10. The affinity of solder for conductive RDL surface allowed solder to de-wet from polymer surfaces and wet only to the exposed portion of RDL shape 8b. This is schematically shown in FIG. 8. Separation of semiconductor substrate region 30, comprised with the solder ball, flip chip features, from semiconductor substrate region 20, which will subsequently experience wire bonding procedures to RDL shape 8a, is next accomplished via dicing procedures, performed through second polymer layer 9, in dicing lane 7b. Scribe line 12, used to separate the completed semiconductor chips is schematically shown in FIG. 9.

Figure 10:
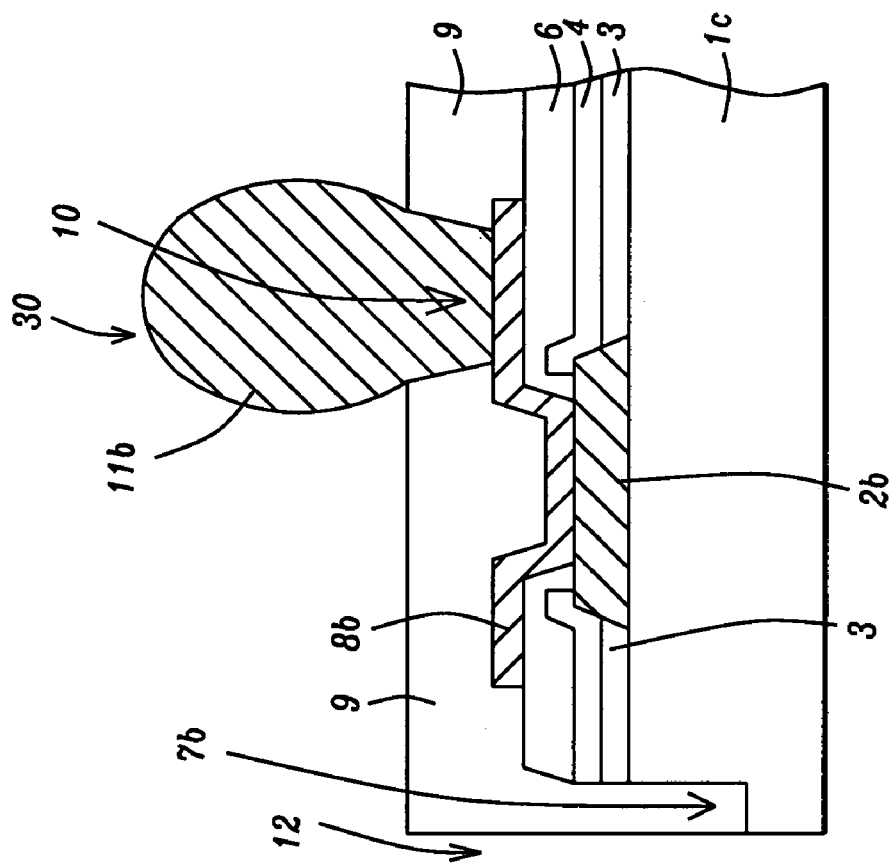

When region 20, of semiconductor substrate 1a, is to be used for devices accommodating wire bonds, the procedure previously described to define opening 10, in second photosensitive polymer layer 9, is also performed in region 20, to form opening 40, in second photosensitive polymer layer 9. This can be accomplished either during, or after the definition of opening 9, in region 30, of semiconductor substrate 1a. Wire bond structure 50, comprised of gold or of other metal components, is then formed on the RDL portion exposed in opening 40. This is schematically shown in FIG. 10.

While this invention has been particularly shown and described with reference to, the preferred embodiments thereof, it will be understood by those skilled in the art that various changes in form and details may be made without departing from the spirit and scope of this invention.

What is claimed is:

1. A method of packaging semiconductor devices for flip chip and wire bond applications, comprising the steps of:
   providing a semiconductor substrate comprised with microelectronic elements wherein a first region of the semiconductor substrate is to be used for wire bond applications while a second region of the semiconductor substrate is to be used for flip chip applications:
   forming a first copper interconnect structure on a portion of said first region of said semiconductor substrate, and forming a second copper interconnect structure on a portion of said second region of said semiconductor substrate;
   forming a low dielectric constant (low k) layer on said semiconductor substrate, with openings in said low k layer exposing a portion of a top surface of said first copper interconnect structure and exposing a portion of a top surface of said second copper interconnect structure;
   forming a first polymer layer with openings in said first polymer layer exposing a portion of said top surface of said first copper interconnect structure and a portion of said top surface of said second copper interconnect structure;
   forming an dicing lane opening in said first polymer layer, in said low k layer and in a top portion of said semiconductor substrate located between copper interconnect structures;
   forming a first conductive shape on said exposed portion of said first copper interconnect structure and forming a second conductive shape on exposed portion of said second copper interconnect structure;
   forming a second polymer layer;
   forming an opening in said second polymer layer exposing a portion of top surface of said second conductive shape;
   forming a solder ball in said opening in said second polymer layer; and
   separating said first region of said semiconductor substrate from said second region of said semiconductor substrate.

2. The method of claim 1, wherein said micro-electronic elements of said semiconductor substrate are metal oxide semiconductor field effect transistors (MOSFET) devices, resistors and capacitors.

3. The method of claim 1, wherein said copper interconnect structures are defined from a copper layer which in turn is obtained via chemical vapor deposition (CVD) or via electroplating procedures at a thickness between about 1,000 to 30,000 Angstroms.

4. The method of claim 1, wherein said copper interconnect structures are defined from a copper layer via a reactive ion etching (RIE) procedure using $Cl_2$ as an etchant for copper.

5. The method of claim 1, wherein said low k layer is a hydrogen silsesquioxane (HSQ) or a non-porous silica layer, formed either via spin-on or via CVD procedures, at a thickness between about 1,000 to 20,000 Angstroms.

6. The method of claim 1, wherein the dielectric constant of said low k layer is between about 2 to 3.

7. The method of claim 1, wherein said openings in said low k layer are formed via a dry etching procedure selectively performed using $CHF_3$ or $CF_4$ as an etchant.

8. The method of claim 1, wherein said first polymer layer is a photosensitive, low k layer such as benzocyclobutene (BCB).

9. The method of claim 1, wherein said first polymer layer is a BCB layer applied at a thickness between about 2,000 to 20,000 Angstroms and comprised with a dielectric constant between about 2.5–2.8.

10. The method of claim 1, wherein said dicing lane is opened via selective etch procedure such as a laser or plasma dry etch procedure using $CHF_3$ or $CF_4$ as a selective etchant for said low k insulator layer.

11. The method of claim 1, wherein said first conductive structure and said second conductive structure are composite structures comprised of an underlying chromium component and an overlying copper or gold component.

12. The method of claim 1, wherein said second polymer layer is a BCB layer applied at a thickness between about 2,000 to 20,000 Angstroms and comprised with a dielectric constant between about 2.5–2.8.

13. The method of claim 1, wherein said solder ball is of a lead bearing or lead free composition.

14. A method of packaging semiconductor devices for flip chip and wire bond applications wherein copper interconnect structures and low dielectric constant (low k) layers are protected via the employment of polymer layers, comprising the steps of:
   providing a semiconductor substrate comprised with micro-electronic elements wherein a first region of the semiconductor substrate is to be used for wire bond applications while a second region of the semiconductor substrate is to be used for flip chip applications;
   forming a copper layer;
   performing a patterning procedure to define a first copper interconnect structure on a portion of said first region of said semiconductor substrate, and to define a second copper interconnect structure on a portion of said second region of said semiconductor substrate;

forming a low dielectric constant (low k) layer;

forming openings in said low k layer exposing a portion of a top surface of said first copper interconnect structure and exposing a portion of a top surface of said second copper interconnect structure;

forming a first photosensitive polymer layer;

forming openings in said first photosensitive polymer layer to expose a portion of top surface of said first copper interconnect structure, to expose a portion of top surface of said second copper interconnect structure, and to expose a portion of top surface of said low k layer in a region located between said first copper interconnect structure and said second copper interconnect structure;

forming an dicing lane in portion of said low k layer and in an underlying top portion of said semiconductor substrate exposed in an opening in said first photosensitive polymer layer, wherein the opening is located between said first copper interconnect structure and said second copper interconnect structure;

forming a first redistribution shape on said exposed portion of said first copper interconnect structure and forming a second redistribution shape on exposed portion of said second copper interconnect structure;

forming a second photosensitive polymer layer;

forming an opening in said second photosensitive polymer layer exposing a portion o of top surface of said second redistribution shape;

placing a solder ball in said opening in said second photosensitive polymer layer, with said solder ball overlying said second redistribution shape;

performing a solder ball reflow anneal procedure; and performing a dicing procedure in said dicing lane to separate said first region of said semiconductor substrate from said second region of said semiconductor substrate.

15. The method of claim 14, wherein said micro-electronic elements of said semiconductor substrate are metal oxide semiconductor field effect transistors (MOSFET) devices, resistors and capacitors.

16. The method of claim 14, wherein said copper layer is obtained via chemical vapor deposition (CVD) or via electroplating procedures at a thickness between about 1,000 to 30,000 Angstroms.

17. The method of claim 14, wherein said patterning procedure used to define said first copper interconnect structure and said second copper interconnect structure is a reactive ion etching (RIE) procedure, using $Cl_2$ as an etchant for copper.

18. The method of claim 14, wherein said low k layer is a hydrogen silsesquioxane (HSQ) or a non-porous silica layer, formed either via spin-on or via CVD procedures at a thickness between about 1,000 to 20,000 Angstroms.

19. The method of claim 14, wherein the dielectric constant of said low k layer is between about 2 to 3.

20. The method of claim 14, wherein said openings in said low k layer are formed via a dry etching procedure selectively performed using $CHF_3$ or $CF_4$ as an etchant.

21. The method of claim 14, wherein said first photosensitive polymer layer is a low k layer such as benzocyclobutene (BCB).

22. The method of claim 14, wherein said first photosensitive polymer layer is a BCB layer applied at a thickness between about 2,000 to 10,000 Angstroms and comprised with a dielectric constant between about 2.5–2.8.

23. The method of claim 14, wherein said first redistribution shape and said second redistribution shape are composite shapes comprised of an underlying chromium component and an overlying copper or gold component.

24. The method of claim 14, wherein said second photosensitive polymer layer is a BCB layer applied at a thickness between about 2,000 to 10,000 Angstroms and comprised with a dielectric constant between about 2.5–2.8.

25. The method of claim 14, wherein said solder ball is comprised of lead between about 90 to 95 weight percent and tin between about 5 to 10 weight percent.

26. The method of claim 14, wherein said solder ball reflow anneal is performed at a temperature between about 150 to 300° C., in a reducing gas ambient.

* * * * *